United States Patent [19]
DeSantis et al.

[11] Patent Number: 5,387,111
[45] Date of Patent: Feb. 7, 1995

[54] ELECTRICAL CONNECTOR

[75] Inventors: John A. DeSantis, N. Lauderdale; Giovanni Jaramillo, Plantation; David C. Everest, III, Tamarac, all of Fla.

[73] Assignee: Motorola, Inc., Schaumburg, Ill.

[21] Appl. No.: 131,238

[22] Filed: Oct. 4, 1993

[51] Int. Cl.$^6$ .............................................. H01R 9/09
[52] U.S. Cl. ..................................... 439/65; 439/511; 439/608
[58] Field of Search ............... 439/511, 608, 108, 65, 439/507, 497, 107

[56] References Cited

U.S. PATENT DOCUMENTS

| | | | |
|---|---|---|---|
| 3,601,755 | 8/1971 | Shields, Jr. | 439/492 |
| 3,721,944 | 3/1973 | Weidler | 439/511 |
| 4,090,667 | 5/1978 | Crimmins | 439/511 |
| 4,781,620 | 11/1988 | Tengler et al. | 439/497 |
| 4,914,062 | 4/1990 | Voltz | 439/608 |
| 5,257,941 | 11/1993 | Lewee et al. | 439/65 |

OTHER PUBLICATIONS

Thomas & Betts Article "High Performance Flexible Interconnects" pp. 2A–6A, 1992.

*Primary Examiner*—P. Austin Bradley
*Assistant Examiner*—Jeanne M. Elpel
*Attorney, Agent, or Firm*—Andrew S. Fuller

[57] ABSTRACT

A low-profile, high density, electrical connector (10), includes multiple layers (19, 22) of substantially parallel electrical conductors (31), the electrical conductors (25) each having a planar portion (29), and spaced ends (31) angling away from the planar portions (29). The planar portions (29) of the electrical conductors (25) are insulated with an insulating material (34). The spaced ends (31) of the electrical conductors (25) on each layer form a row of connector pins (13, 16). The connector (10) is formed by attaching the multiple layers (19, 22) along the insulated planar portions (29) of the conductors (25) to form a substantially rigid, low profile, multilayered structure.

6 Claims, 2 Drawing Sheets

ELECTRICAL CONNECTOR

TECHNICAL FIELD

This invention relates in general to electrical connectors, and in particular, to low profile, high density electrical connectors.

BACKGROUND

Manufacturers often combine multiple circuit boards in the assembly of an electronic device. This is common in platform manufacturing where a standard circuit board is combined with one or more customized circuit boards to implement a particular solution. The boards are usually electrically interconnected to facilitate the transfer of electrical signals between the boards. To meet new demands of increasing packaging density, lowering manufacturing costs, and improving interconnection integrity, many board interconnection schemes have been explored. Among the many interconnection schemes are flexible circuit jumpers, cable connector assemblies, and pin and socket connectors.

In applications which require a high connector density, i.e., many electrical contact points in a small area, and which have critical connector height restrictions, the flexible circuit jumper has seen wide use. The flexible circuit jumper offers a high connector density and very good low profile characteristics. However, in some cases flexible circuit jumpers must be properly oriented and soldered into place, and may suffer from potential misalignment problems during the soldering process. Moreover, the flexible circuit jumper may be damaged or destroyed if the boards have to be separated for any reason. Current cable connector assemblies do not give the high contact densities desired in applications requiting contact densities of 1.27 mm. centers, or better. Additionally, the elasticity of the flexible cable connectors may prove difficult for proper handling during assembly. Traditional pin and socket arrangements tend to have high profiles and may not be suitable for certain low profile connection applications.

It is desirable to have a low profile, high density, electrical connector for electrically connecting multiple circuit boards. Therefore, there exists a need for a new, high density, low profile, electrical connector.

DETAILED DESCRIPTION OF THE PREFERRED EMBODIMENT

Generally, the present invention provides a low profile, high density, electrical connector, which, among other potential applications, can provide for a low cost board-to-board interconnect device. The invention achieves high density, i.e., a high number of electrical contacts in a given area, by providing multiple rows of connector pins in a small area. A connector, in accordance with the invention, can achieve contact densities of 1.27 mm. centers, or better. To achieve a low profile, the invention incorporates the use of stack layers of electrical conductors which are insulated and shielded as necessary. Moreover, the invention achieves low cost in by using a simple construction whereby the electrical conductors function as both the connector pins and as the transmission lines between the connector pins.

Figure 1:
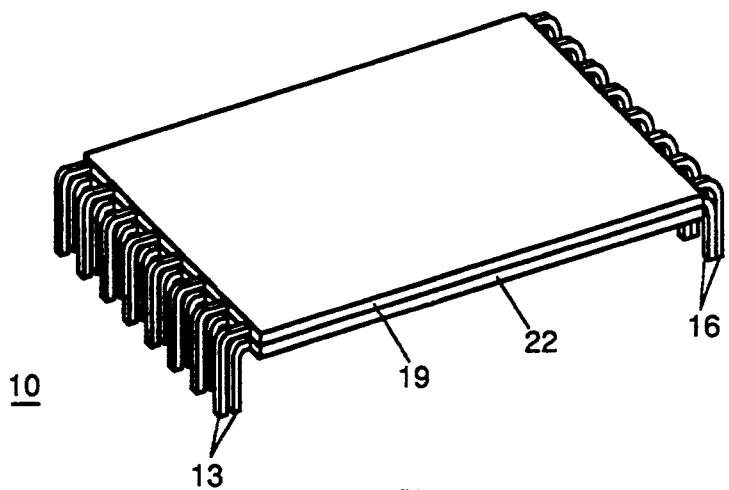
FIG. 1 is an electrical connector in accordance with the present invention.
Figure 2:
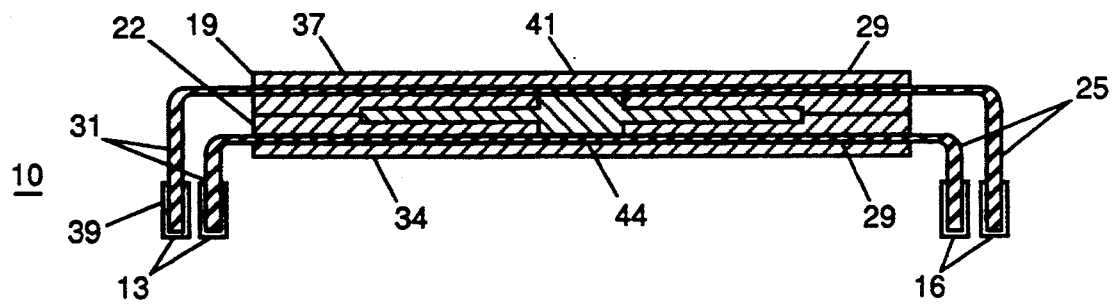
FIG. 2 is a cross-sectional view of the connector of FIG. 1.
Figure 3:
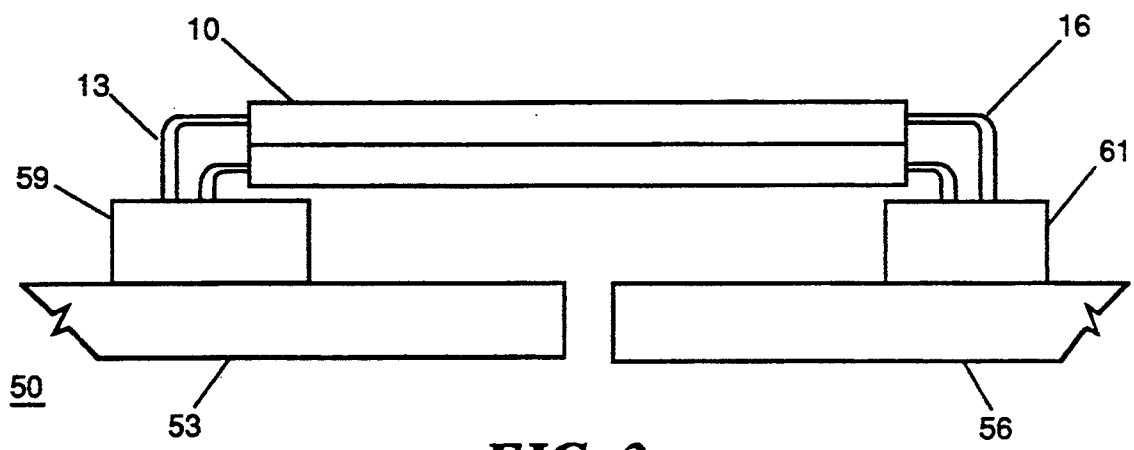
FIG. 3 is a circuit board assembly having multiple boards electrically connected by the connector of FIG. 1, in accordance with the present invention.

The present invention can be more fully understood with references to FIGS. 1, 2 and 3. FIG. 1 shows an embodiment of the electrical connector 10, and illustrates the connector's high density and low profile characteristics. The connector 10 has a first and second plurality of multiple row connector pins 13, 16, connected by an insulated two layer planar section. The result is a U-shaped male connector 10 in with a fiat, planar portion, and multiple rows of connector pins 13, 16 forming the legs of the structure. The connector 10 shape is convenient for direct insertion into socket connectors (see FIG. 3), and the connector 10 is sufficiently rigid to withstand the force required for socket insertion.

Referring to FIG. 2, a cross-sectional view of the electrical connector 10 is shown. The connector 10 has a first layer 19 and a second layer 22 of substantially parallel electrical conductors 25 formed from copper. The connector 10 could have more than two layers of conductors if necessary. Each electrical conductor 25 has a planar portion 29 which is insulated, and spaced ends 31 at the opposing ends of the planar portions 29 which are not insulated. The spaced ends 31 of the electrical conductors 25 on each layer 19, 22 angle away from the planar portion 29, in a substantially perpendicular form, to form a row of connector pins 13, 16. The conductors 25 of each layer 19, 22 are formed from individual wires which are arranged substantially parallel and coplanar with each other. The planar portions 29 of the conductors 25 are flattened to further reduce height. At opposing ends of the planar portion 29, the conductors 25 are formed to orient substantially perpendicular to the planar portion 29. Each layer of conductors 25 is oriented at the spaced ends 31 to form a row of connector pins 13, 16 at each spaced end. Both layers 19, 22 of conductors 25 combine to form two rows of connector pins 13, 16 at opposing sides of the planar portion 29. The connector pins 13, 16, which are formed from copper, are plated with nickel and gold 39 to enhance electrical conductivity.

The planar portions 29 of the conductors 25 of each layer 19, 22 are encapsulated in insulating material 34, thereby maintaining individual conductors 25 in a space relation insulated from each other. The insulation may be accomplished by encasing the conductors 25 between plastic sheets, and laminating the sheets to form a single structure. The insulating material 34 may be polyimide, polyester, or such other material which can provide insulation without significantly increasing the dimensions of the connector 10. For example, in the preferred embodiment, polyimide is used to encase the electrical conductors 25, such that the additional increase in the dimension of the connector 10 is not substantial relative to the size of the conductors 25 themselves. The intent is to minimize the cross-sectional area throughout the planar section of the connector 10, thereby achieving a low profile.

To achieve a high density configuration, and to provide other benefits such as structural integrity, multiple layers 19, 22 of conductors 25 are combined together in a structural unit. The first and second layers 19, 22 are bonded together such that the first layer 19 overlays the second layer 22, and attaches thereto along the insulated planar portions 29 of the conductors 25. This arrangement forms a substantially rigid, low profile, multilayer structure.

Many applications require electrical shielding to insure the proper transmission of electrical signals within conductors 25 of the connector 10. As such, an electrical shield 37 is disposed between the first and second layers 19, 22 of conductors 25 along the insulated planar portions 29. The shield 37 comprises conductive material such as copper, but may be any other conductive material. In the preferred embodiment, the shield 37 is selectively, electrically coupled to at least one conductor 41 on the first layer 19, and at least one conductor 44 on the second layer 22. This configuration provides electrical shielding for at least some of the conductors 25, from the first and second layers 19, 22. Preferably, the conductive material of the electrical shield 37 breaches the insulation of, and establishes electrical contact with, the at least one conductor 41 on the first layer 19 and the at least one conductor 44 on the second layer 22 to electrically coupled shield 37.

Referring to FIG. 3, a fragmentary circuit board assembly 50 is shown wherein multiple circuit boards 53, 56 are electrically connected using the electrical connector 10. The circuit board assembly 50 includes a first circuit board 53 having a first electrical socket 59, and a second circuit board 56 adjacent to the first circuit board 53, the second circuit board 56 having a second electrical socket 61. The electrical connector 10 electrically connects the first circuit board 53 to the second circuit board 56 with the first plurality of connector pins 13 engaging the first socket 59 and the second plurality of connector pins 16 engaging the second socket 61. It can be seen that the electrical connector 10 provides a low profile high density electrical connection between both circuit boards, thus enabling multiple circuit boards 53, 56 to be connected without unduly sacrificing space because of connector height.

Figure 4:
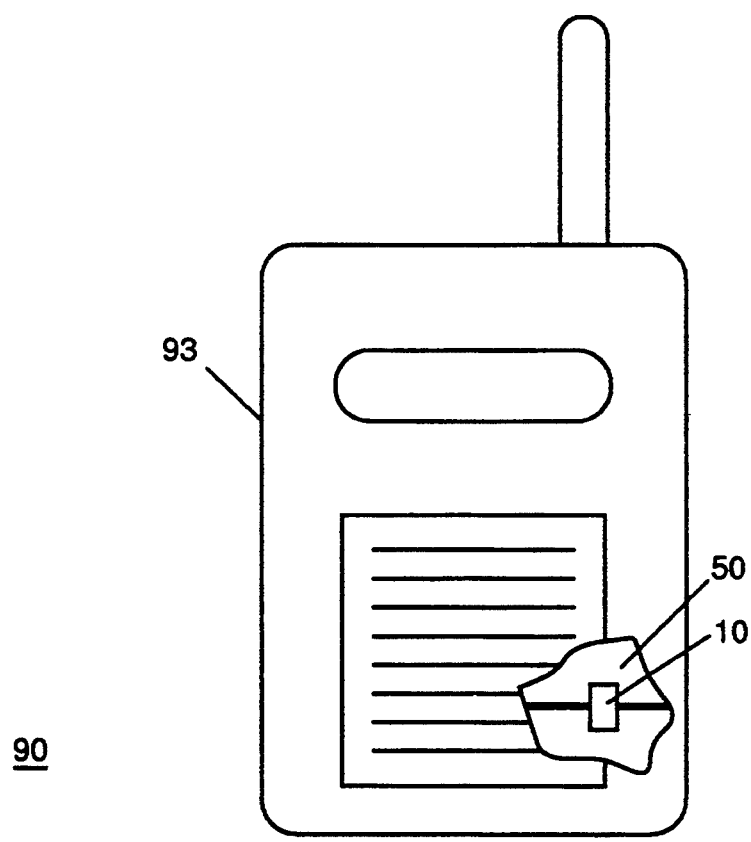
FIG. 4 is a communication device incorporating the circuit board assembly of FIG. 3, in accordance with the present invention.

Referring to FIG. 4, a front view of a communication device that incorporates the present invention, is shown. The communication device 90 is a conventional two-way radio, as known in the art, which houses communications circuitry for communicating over a radio frequency channel. The communication device 90 includes a communication device housing 93 which receives the circuit board assembly 50, including the electrical connector 10.

The electrical connector 10, according to the invention, has many advantages. One important aspect is its low profile. Use of the connector 10 avoids the problem of potential misalignment during the soldering process associated with flexible circuit jumpers used in the prior art as a solution for low profile applications. Unlike cable connectors, which may be difficult to handle during assembly, or traditional high profile pin and socket solutions, the connector 10 offers the rigidity and convenience of a connector socket arrangement in a low profile, high density package which can achieve contact densities of 1.27 mm. centers, or better. Furthermore, the integral electrical shield 37 improves the electrical performance of the connector 10.

What is claimed is:

1. A low-profile, high density, electrical connector, comprising:

a first layer and a second layer of substantially parallel electrical conductors, the electrical conductors each having a planar portion, and spaced ends angling away from the planar portion, the planar portions of the electrical conductors being insulated between thin layers of an insulating material, the electrical conductors being flattened along the planar portions to reduce height, the spaced ends of the electrical conductors on each layer forming a row of connector pins;

the first layer being overlaid on the second layer and attached thereto along the insulated planar portions of the conductors to form a substantially rigid, low profile, multilayered structure;

an electrical shield disposed between the first and second layers along the planar portions, which breaches the insulating material of the at least one conductor on the first layer and the at least one conductor on the second layer to electrically couple the shield, thereby providing electrical shielding for at least some of the conductors on the first and second layers.

2. The electrical connector of claim 1, wherein the connector pins are plated with nickel and gold.

3. The electrical connector of claim 1, wherein the connector is a U-shaped male connector with a planar portion and multiple rows of connector pins.

4. A circuit board assembly comprising:

a first circuit board having a first electrical socket thereon;

a second circuit board adjacent to the first circuit board, the second circuit board having a second electrical socket thereon; and a low-profile, high density, electrical connector, electrically connecting the first circuit board to the second circuit board, the connector comprising:

a first layer and a second layer of substantially parallel electrical conductors, the electrical conductors each having a planar portion, and spaced ends angling away from the planar portion, the planar portions of the electrical conductors being flattened to reduce height, the planar portions of the electrical conductors being insulated with an insulating material, the spaced ends of the electrical conductors on each layer forming a row of connector pins;

the first layer being overlaid on the second layer and attached thereto along the insulated planar portions of the conductors to form a substantially rigid, low profile, multilayered structure;

an electrical shield disposed between the first and second layers along the planar portions, which breaches the insulating material of the at least one conductor on the first layer and the at least one conductor on the second layer to electrically couple the shield, thereby providing electrical shielding for at least some of the conductors on the first and second layers;

the connector having a first plurality of connector pins engaging the first socket and a second plurality of connector pins engaging the second socket.

5. A communication device, comprising:

a communication device housing; and a low-profile, high density, electrical connector housed in the communication device housing, the connector comprising:

a first layer and a second layer of substantially parallel electrical conductors, the electrical conductors each having a planar portion, and spaced ends angling away from the planar portion, the electrical conductors being flattened along the planar portions to reduce height, the planar portions of the electrical conductors being insulated with an insulating material, the spaced ends of the electrical conductors on each layer forming a row of connector pins;

the first layer being overlaid on the second layer and attached thereto along the insulated planar portions of the conductors to form a substantially rigid, low profile, multilayered structure;

an electrical shield disposed between the first and second layers along the planar portions, which breaches the insulating material of the at least one conductor on the first layer and the at least one conductor on the second layer to electrically couple the shield, thereby providing electrical shielding for at least some of the conductors on the first and second layers.

6. The communication device of claim 5, further comprising:

a first circuit board having a first electrical socket thereon; and a second circuit board adjacent to the first circuit board, the second circuit board having a second electrical socket thereon;

the connector having a first plurality of connector pins engaging the first socket and a second plurality of connector pins engaging the second socket to electrically connect the first circuit board to the second circuit board.

* * * * *